United States Patent

Moon

[11] Patent Number: 6,080,597
[45] Date of Patent: Jun. 27, 2000

[54] TEST PATTERN STRUCTURE FOR MEASURING MISALIGNMENT IN SEMICONDUCTOR DEVICE FABRICATION PROCESS AND METHOD FOR MEASURING MISALIGNMENT

[75] Inventor: Il-Young Moon, Choongcheongbuk-Do, Rep. of Korea

[73] Assignee: LG Semicon Co., Ltd., Choongcheongbuk-Do, Rep. of Korea

[21] Appl. No.: 09/417,776

[22] Filed: Oct. 14, 1999

[30] Foreign Application Priority Data

Nov. 4, 1998 [KR] Rep. of Korea ...................... 98-47104

[51] Int. Cl.$^7$ .................................................. H01L 21/66
[52] U.S. Cl. .................................. 438/17; 438/18; 257/48
[58] Field of Search .................................... 438/401, 462, 438/800, 17, 18; 257/797, 798, 48

[56] References Cited

U.S. PATENT DOCUMENTS 4,347,479  8/1982  Cullet ......................................... 324/64
5,770,995  6/1998  Kamiya .................................... 338/118

OTHER PUBLICATIONS

Ulrich Kaempf, The Wheatstone Bridge as an Alignment Test Structure, Proc. IEEE 1995 Int. Conference on Microelectronic Test Structures, vol. 8, Mar. 1995, pp. 27–30.

Primary Examiner—Charles Bowers
Assistant Examiner—Craig Thompson
Attorney, Agent, or Firm—Morgan, Lewis & Bockius LLP

[57] ABSTRACT

A test pattern structure and a misalignment measuring method for measuring a misalignment between multiple patterns happening during a semiconductor device fabrication process are disclosed. The test pattern structure includes a semiconductor substrate, a plurality of first conductive layer patterns, a plurality of second conductive layer patterns, a plurality of resistors, first and second pads, and a plurality of electrical connections. The first conductive layer patterns are formed spaced-apart on the semiconductor substrate in a predetermined direction, the second conductive layer patterns are formed spaced-apart on the semiconductor substrate, and the resistors are formed on the semiconductor substrate electrically connected to a respective one of the second conductive layer patterns. Each one of the second conductive layer patterns are paired with a respective one of the first conductive layer patterns such that each pair of first and second conductive layer patterns define a horizontal separation distance wherein the horizontal separation distances of the respective pairs of first and second conductive layer patterns increase along the predetermined direction. The first pad is connected to a first one of the first conductive layer patterns, the electrical connections connects the second conductive layer patterns to a respective next one of the first conductive layer patterns, and the second pad commonly connected with the resistors.

22 Claims, 10 Drawing Sheets

TEST PATTERN STRUCTURE FOR MEASURING MISALIGNMENT IN SEMICONDUCTOR DEVICE FABRICATION PROCESS AND METHOD FOR MEASURING MISALIGNMENT

This application claims the benefit of Application No. 47104/1998, filed in Korea on Nov. 4, 1998, which is hereby incorporated by reference.

BACKGROUND OF THE INVENTION

1. Field of the Invention

The present invention relates to a test pattern structure for measuring a misalignment in a semiconductor device fabrication process and a measuring method thereof, and more particularly, to an improved test pattern structure for electrically measuring a misalignment between multi-layer patterns in a semiconductor device fabrication process and a measuring method thereof.

2. Description of the Related Art

Generally, a semiconductor device is fabricated by forming a thin film, etching the thin film to form a first thin film pattern, and forming a second thin film pattern on the first thin film pattern.

Therefore, as the design rule (or size) of the semiconductor devices decrease, the alignment between the lower layer thin film pattern and the upper layer thin film pattern becomes increasingly important. For example, a misalignment between an upper layer thin film pattern and a lower layer thin film pattern may cause a portion where the thin film patterns should be electrically connected to become electrically disconnected. Similarly, an electrical short circuit may be formed in a portion that should be electrically isolated. These misalignments cause the semiconductor device to be defective. Therefore, it is necessary to detect any misalignment and determine if a wafer has a large misalignment that needs to be immediately rectified. Such detection will decrease the fabrication cost.

A conventional misalignment evaluation method will now be explained, beginning with the conventional test pattern structure and fabrication method for evaluating the misalignment.

FIG. 1D illustrates the structure of the test pattern for electrically evaluating the misalignment. Namely, the test pattern structure is formed such that two U-shape portions are closely opposite to each other, thereby forming an elliptical shape. The inverted U-shape portion is positioned in the upper portion, and the U-shape portion is positioned in the lower portion. The left side portion of the inverted U-shape portion is called a leg portion LEG1, and the right side portion of the same is called a leg portion LEG3. In addition, the left side portion of the U-shape is called a leg portion LEG2, and the right side portion of the same is called a leg portion LEG4. The width of the leg portion LEG1 is W1, the width of the leg portion LEG2 is W2, the width of the leg portion LEG3 is W3, and the width of the leg portion LEG4 is W4. The length of the leg portions LEG1 and LEG3 of the inverted U-shape portion is L1, and the length of the leg portions LEG2 and LEG4 of the U-shape portion is L2.

In the conventional test pattern, as shown in FIG. 1A, the conductive layer formed on the semiconductor substrate is etched using a first mask M1, thereby forming the conductive layer pattern having the same shape as the first mask M1 on the semiconductor substrate. In addition, the conductive pattern is partially etched using a second mask M2 as shown in FIG. 1B. After the etching process using the first mask M1, the positions of the semiconductor substrate and the mask are accurately aligned using the second mask M2 during the etching process. With this alignment, the widths W1, W2, W3 and W4 of the leg portions LEG1, LEG2, LEG3 and LEG4 as shown in FIG. 1D are all identical, and the lengths L1 and L2 are identical. FIG. 1C illustrates the resulting structure when the second mask M2 of FIG. 1B is accurately aligned with respect to the first mask M1 of FIG. 1A. The portion indicated by reference numeral 11 in the first mask M1, as shown in FIG. 1A, represents a pattern 11 corresponding to the portion remaining on the semiconductor substrate from the first mask M1 of FIG. 1A, and a pattern 12 corresponding to the open portion 12. In addition, pattern 13 corresponds to a portion remaining on the semiconductor substrate from the second mask M2 of FIG. 1B, and pattern 14 represents an opening portion. In the drawings, the open portion 14 from the second mask M2 is shown by a hatched line.

FIG. 2A illustrates the structure in which the second mask M2 is misaligned with respect to the first mask M1 by a distance "dW" in the leftward direction. FIG. 2B illustrates the structure of the test pattern formed as a result of the misalignment of FIG. 2A. Namely, in the test pattern obtained without any misalignment, the four leg portions of the U-shaped pattern has the identical widths W1, W2, W3 and W4 in FIG. 1D. However, the widths W1 and W4 as shown in FIG. 2B are narrower than the width W by "dW", and the widths W2 and W3 are wider than the width W by "dW". The widths W1 and W4 are identical, and the widths W2 and W3 are identical. In FIG. 2B, points A, B, C and D represent portions from which voltage will be measured to determine the misalignment, as will be discussed later with respect to FIG. 4.

FIGS. 3A through 3H illustrates the fabrication processes for forming the test pattern as shown in FIG. 1D. Namely, FIGS. 3A through 3H illustrate the cross-sectional views taken along the line IIIh—IIIh of FIG. 1D.

As shown in FIG. 3A, an insulation film 102 is formed on a semiconductor substrate 100 (or the wafer). A conductive layer 104 is formed on the insulation film 102. A first photoresist film 106 is formed on the conductive layer 104. Next, as shown in FIG. 3B, a first photoresist film pattern 106a is formed from the photoresist film 106 using the first mask M1 (as shown in FIG. 1A). Thus, the first photoresist film pattern 106a has the same shape as the first mask M1. As shown in FIG. 3C, the conductive layer 104 is etched using the first photoresist film pattern 106a as a mask, thereby forming a conductive layer pattern 104a having the same shape as the first mask M1. Next, the first photoresist film pattern 106a is removed, thereby forming the structure of FIG. 3D. Namely, the conductive layer pattern 104a as shown in FIG. 1A is exposed on the uppermost surface of the semiconductor substrate.

A second photoresist film 108 is formed on the entire structure of FIG. 3D, thereby forming the structure of FIG. 3E. As shown in FIG. 3F, the second photoresist film 108 is patterned using the second mask M2 of FIG. 1B, thereby forming a second photoresist film pattern 108a. At this time, an open portion 14 is formed on the center portion of the conductive layer pattern 104a by patterning the second photoresist film pattern 108a.

Next, the conductive layer pattern 104a exposed through the open portion 14 is etched using the second photoresist film pattern 108a, thereby forming a conductive layer pattern 104b as shown in FIG. 3G. However, in the process of FIG. 3F, if the second mask M2 is accurately aligned on the semiconductor substrate 100 of FIG. 3E, the open portion 14 is formed accurately on a center portion of the conductive layer pattern 104a. Therefore, in the process of FIG. 3G, the widths (W1 and W3) of the left and right sides of the conductive layer pattern 104b with respect to the center of the open portion 14 are same. However, in the process of FIG. 3F, if the second mask M2 is misaligned in the direction of an X-axis, the open portion 14 is formed on a portion moved toward the left side of the conductive layer pattern 104a. Therefore, in the process of FIG. 3G, the width W1 is narrower than the width W3. Then, as shown in FIG. 3H, the second photoresist pattern 108a is removed, thereby forming the structure of the test pattern.

In the test pattern, the principle for measuring the misaligned degree dW is implemented based on the Wheatstone bridge measurement principle. FIG. 4 illustrates a Wheatstone bridge circuit that is equivalent to the test pattern structure of FIGS. 1D or 2B.

The resistances of the resistors R1, R2, R3 and R4 may be computed based on the test pattern of FIG. 2B in the Wheatstone bridge circuit of FIG. 4. The resistance of each resistor R may be computed as $R_i = R_s \times L/W_i$ (with i=1–4), where $R_s$ represents a sheet resistivity of the conductive layer pattern, L represents the length of a bridge of the U-shape test pattern, and $W_i$ represents the width of the corresponding portion of the bridge of the test pattern. These values may be directly measured based on the test pattern.

As shown in FIG. 2B, there is a misalignment in the direction of the X-axis, and there is not a misalignment in the direction of the Y-axis. Therefore, the lengths of the LEG1, LEG2, LEG3 and LEG4 of the test pattern are all identical and are determined as L. However, W1=W4=W−dW, and W2=W3=W+dW due to the misalignment in the direction of the X-axis, where W represents the width of the bridge of the U-shape pattern, and dW represents a distance of the misalignment in the direction of the X-axis. That is, W is the theoretical value and dW is the shift.

Therefore, in the Wheatstone bridge circuit having a value equal to the circuit shown in FIG. 2B, R1 equals R4 (hereinafter called "$R_a$"), and R2 equals R3 (hereinafter called "$R_b$"). The current $I_a$ flowing along the path "a" is identical to the current $I_b$ flowing along the path "b" (in accordance with the characteristic of the Wheatstone bridge) which is ½, where I represents the current before the bridge.

Therefore, the voltage difference $V_o$ between the point C and the point D is as follows:

$$V_O = \frac{I}{2} \times (Ra - Rb) \quad (1)$$

In addition, the voltage V (the voltage difference between the point A and the point B)

$$V = \frac{I}{2} \times (Ra + Rb) \quad (2)$$

passed through the bridge is as follows:

$$Ra = Rs \times \frac{L}{W - dW}, \text{ and } Rb = Rs \times \frac{L}{W + dW} \quad (3)$$

At this time, since $R_a$ and $R_b$ satisfy the equations:

$$dW = \frac{V_O}{V} \quad (4)$$

are obtained, the misalignment may be expressed as follows:

Therefore, if the voltage $V_o$ is zero based on the test pattern, the misalignment dW becomes zero, and it is noted that the thin film pattern between the interlayers is accurately aligned.

However, there is a problem in adapting the misalignment to all fabrication processes for a semiconductor device based on the conventional Wheatstone bridge measuring method in view of the fabrication process of the semiconductor device. Namely, as shown in FIGS. 3A through 3H, it is necessary that a conductive pattern be formed using a first mask pattern and then etched using a second mask pattern. In the conventional art, the identical conductive layers are etched two times before measuring the misalignment. Namely, in the conventional art, the misalignment is not measured using the pattern between the different interlayers.

However, in the conventional processes for fabricating semiconductor devices, such as DRAMs (Dynamic Random Access Memory), the above-described processes are not performed. Namely, there are no processes where an equivalent conductive layer is etched using different masks more than two times. Therefore, during such semiconductor device fabrication, the conventional misalignment measuring method is not suitable since the test pattern is not formed on the wafer. Moreover, since the test wafer is used for measuring the misalignment using the conventional Wheatstone method, the fabrication cost of the semiconductor device is increased.

SUMMARY OF THE INVENTION

Accordingly, the present invention is directed to a test pattern structure for measuring misalignment in semiconductor device fabrication process and a measuring method that substantially obviates one or more of the problems due to limitations and disadvantages of the related art.

Accordingly, it is an object of the present invention to provide a test pattern structure for measuring a misalignment in a semiconductor device fabrication process and a measuring method that are capable of adapting to a common semiconductor device having a multi-layer thin film pattern.

It is another object of the present invention to provide a test pattern structure for measuring a misalignment in a semiconductor device fabrication process, and a measuring method that uses a combined resistance value based on a connection and disconnection between the conductive layer patterns formed on different layers.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the test pattern structure for measuring a misalignment of a semiconductor device fabrication process comprises a semiconductor substrate; a plurality of spaced-apart first conductive layer patterns formed on the semiconductor substrate in a predetermined direction; a plurality of spaced-apart second conductive layer patterns formed on the semiconductor substrate such that each one of the second conductive layer patterns are paired with a respective one of the first conductive layer patterns, each pair of first and second conductive layer patterns defining a horizontal separation distance wherein the horizontal separation distances of the respective pairs of first and second conductive layer patterns increase along the predetermined direction, a plurality of resistors formed on the semiconductor substrate, each of the resistors electrically connected to a respective one of the second conductive layer patterns; a first pad connected to a first one of the first conductive layer patterns; a plurality of electrical connections connecting the second conductive layer patterns to a respective next one of the first conductive layer patterns; and a second pad commonly connected with the resistors.

In another aspect, a method for measuring a misalignment of a semiconductor device fabrication process comprises the steps of forming a plurality of resistors on a semiconductor substrate, forming a plurality of first conductive layer patterns electrically isolated from the resistors; forming a plurality of second conductive layer patterns each respectively paired with a corresponding one of the first conductive layer patterns to define a plurality of pairs of first and second conductive layer patterns, each of the pairs of conductive layer patterns defining a respective horizontal separation distance; forming a conductive layer electrically isolated from the first and second conductive layer patterns; and patterning the conductive layer to form a first pad, a first electrical connection connecting the first pad with a first one of the first conductive layer patterns, a second pad, a second electrical connection commonly connecting the first ends of the resistors with the second pad, a plurality of third wires connecting the resistors and respective ones of the second conductive layer patterns, and a plurality of fourth electrical connections connecting the second conductive layer patterns to a respective next one the first conductive layer patterns.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
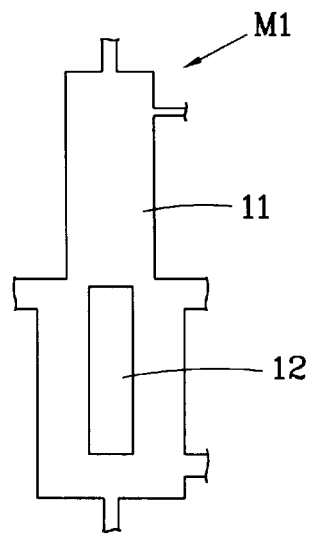
FIGS. 1A through 1D are plan views illustrating a conventional fabrication method of a test pattern for measuring a misalignment.
Figure 1B:
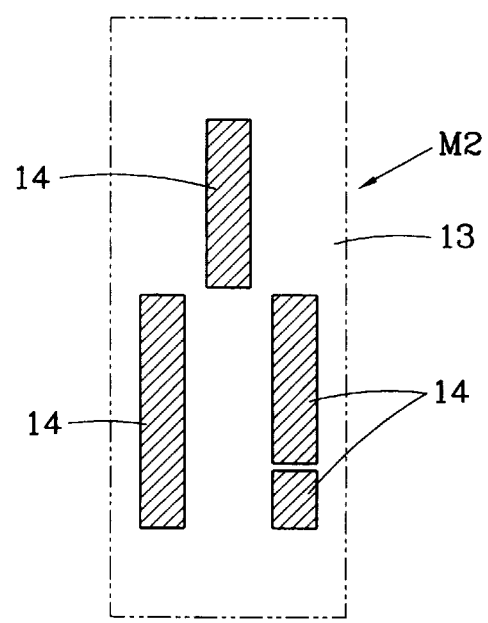
Figure 1C:
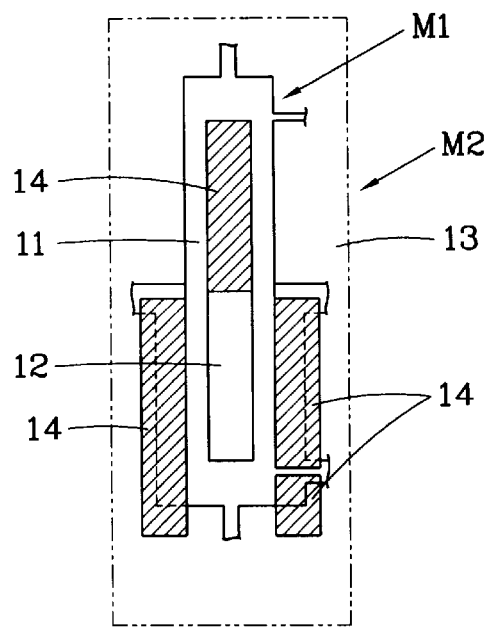
Figure 1D:
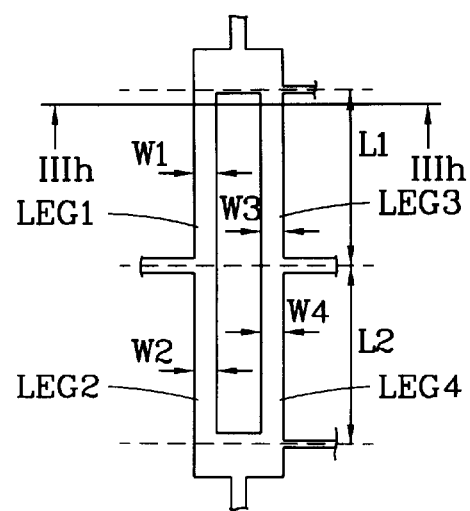
Figure 2A:
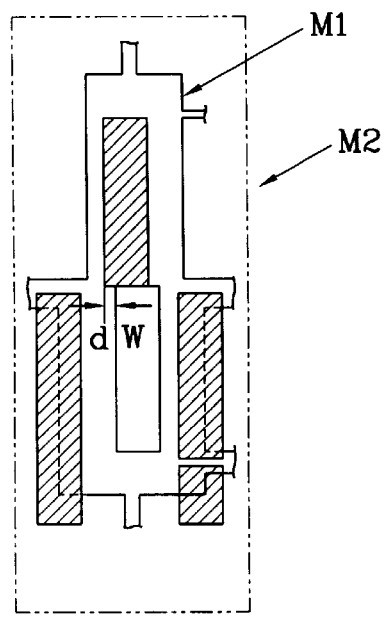
FIGS. 2A and 2B are plan views illustrating the structure of a test pattern when a misalignment occurs in a known test pattern structure.
Figure 2B:
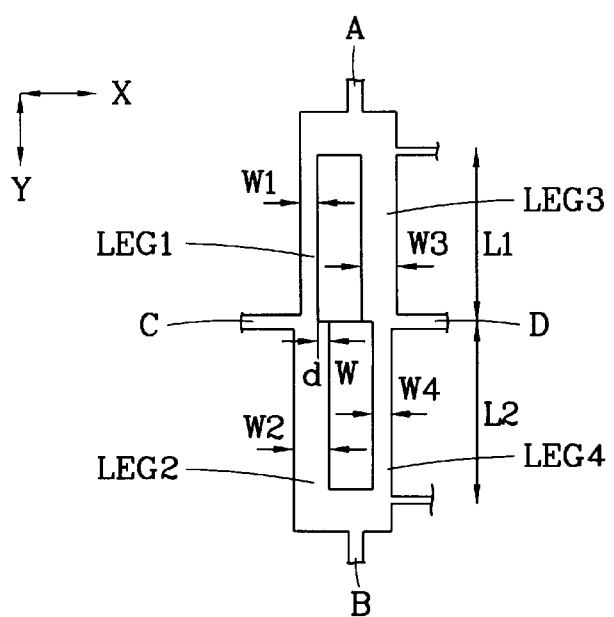
Figure 3A:
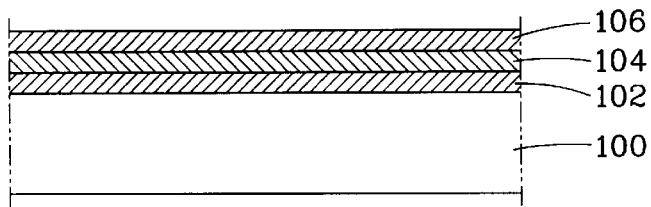
FIGS. 3A through 3H are cross sectional views illustrating a semiconductor substrate for explaining a conventional test pattern fabrication sequence.
Figure 3B:
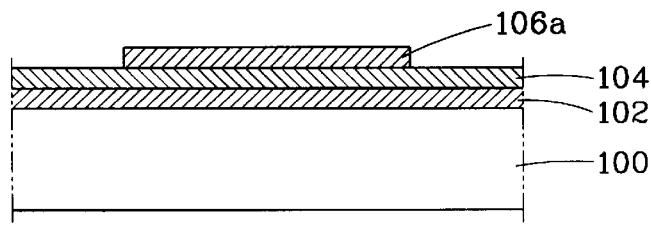
Figure 3C:
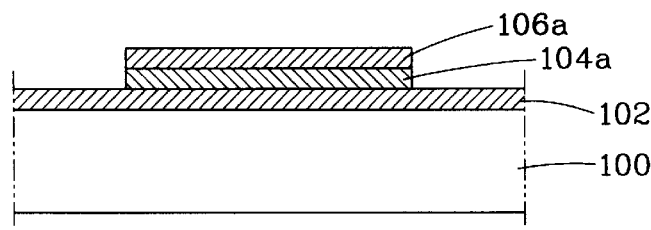
Figure 3D:
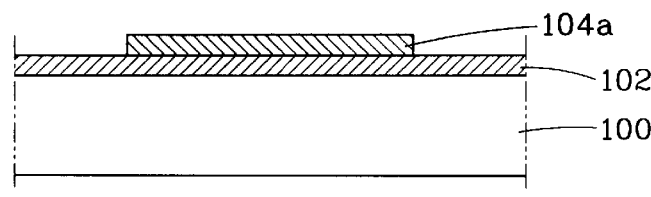
Figure 3E:
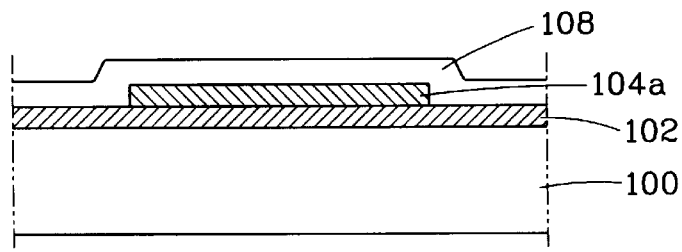
Figure 3F:
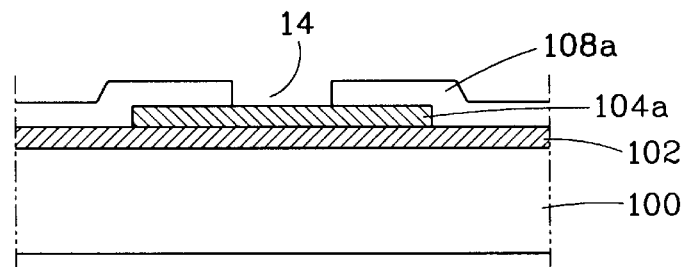
Figure 3G:
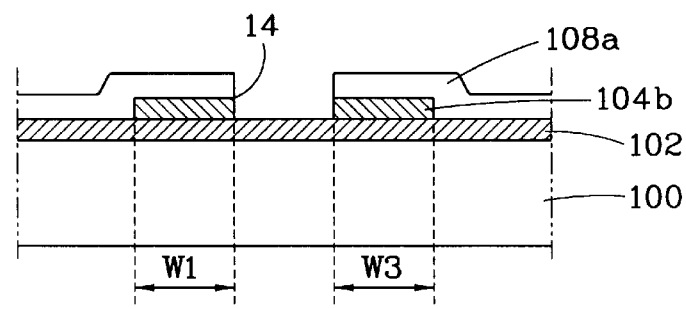
Figure 3H:
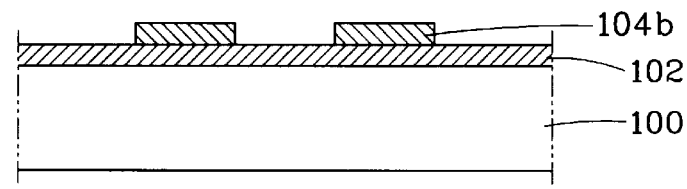
Figure 4:
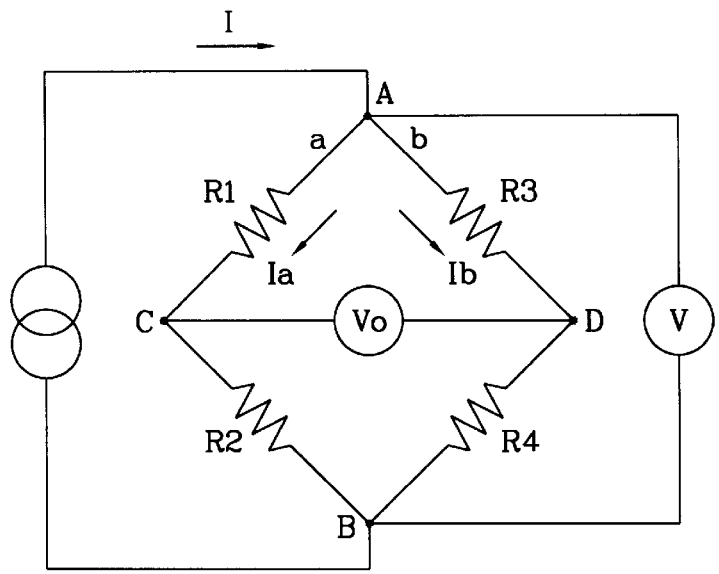
FIG. 4 is a view illustrating an equivalent circuit of a conventional test pattern.
Figure 5:
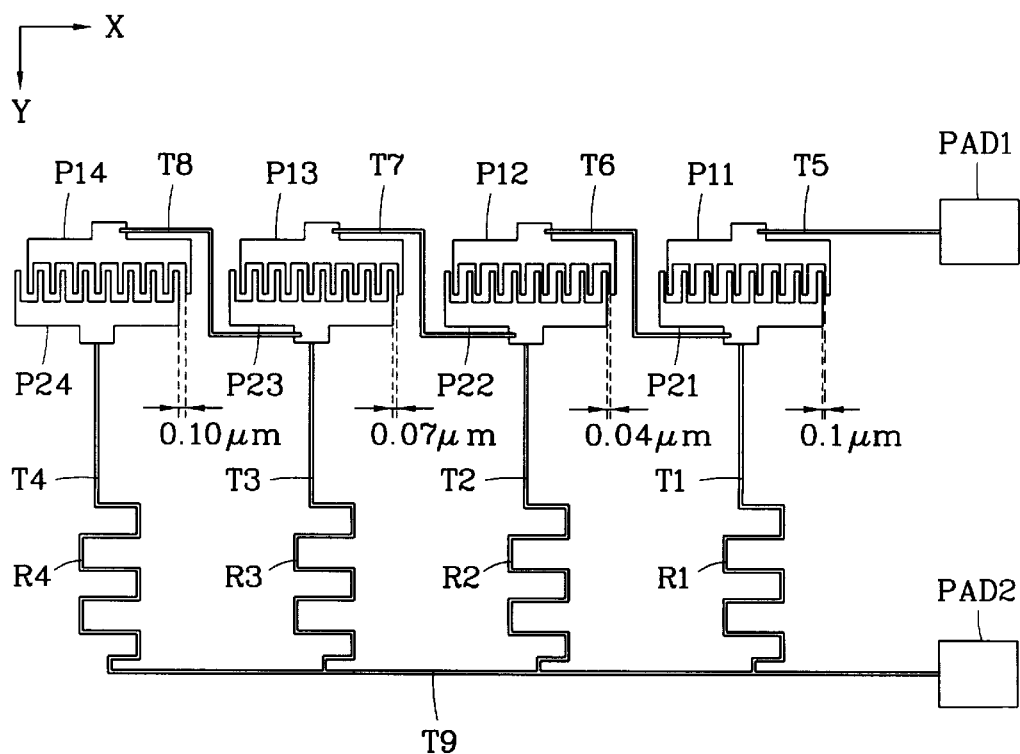
FIG. 5 is a view illustrating the structure of a test pattern according to an embodiment of the present invention.

FIG. 5 illustrates the structure of a test pattern according to an embodiment of the present invention. Namely, a plurality of comb-shape first conductive layer patterns P11, P12, P13 and P14, each having a plurality of teeth, and a plurality of comb-shape second conductive layer patterns P21, P22, P23 and P24, each having a plurality of teeth, are arranged on a semiconductor substrate with the teeth being alternately engaged. The width of the teeth of the first conductive layer patterns P11, P12, P13 and P14 and the second conductive layer patterns P21, P22, P23 and P24 are formed wider than the width of the misalignment. For example, in order to measure the misalignment up to 0.09 $\mu$m, the width of each tooth is 0.09 $\mu$m. FIG. 5 illustrates four pairs of the conductive layer patterns.

The horizontal distance between the first conductive layer pattern P11 and the second conductive layer pattern P21 formed in the rightward most portion in the drawings is 0.01 $\mu$m. Therefore, the conductive layer patterns P11 and P21 are arranged so that the edge lines of the teeth of the first conductive layer pattern P11 and the second conductive layer pattern P21 form a straight line in the vertical direction. The first conductive layer pattern P11 and the second conductive layer pattern P21 are not electrically connected because they are formed on different layers. However, the slightest shift causing any overlap will result in an electrical connection.

The horizontal distance between the first and second conductive layer patterns P12 and P22, which are formed adjacent to the conductive layer patterns P11 and P21, is 0.04 $\mu$m. Therefore, since the teeth of the first conductive layer pattern P12 and the teeth of the second conductive layer pattern P22 do not contact, electrical current cannot flow between the first conductive layer pattern P12 and the second conductive layer pattern P22.

The horizontal distance between the first and second conductive layer patterns P13 and P23, which are formed adjacent to the conductive layer patterns P12 and P22, is 0.07 $\mu$m. Therefore, since the teeth of the first conductive layer pattern P13 and the teeth of the second conductive layer pattern P23 do not contact, current cannot flow between the first conductive layer pattern P13 and the second conductive layer pattern P23.

The horizontal distance between the first and second conductive layer patterns P14 and P24, which are formed adjacent to the conductive layer patterns P13 and P23, is 0.10 $\mu$m. Since the teeth of the first conductive layer pattern P14 and the second conductive layer pattern P14 do not contact, current cannot flow between the first conductive layer pattern P14 and the second conductive layer pattern P24.

A plurality of high resistance portions R1, R2, R3 and R4 are spaced-apart from the conductive layer patterns P11 and P21, P12 and P22, P13 and P23, and P14 and P24 in the Y-axis direction. These high resistance portions respectively correspond to the conductive layer patterns P11 and P21, P12 and P22, P13 and P23, and P14 and P24.

The resistance values of the resistors R1, R2, R3 and R4 have an identical value, R. Preferably, the resistance value R is a large as compared to the combined resistance of the conductive layer patterns P11, P12, P13, P14, P21, P22, P23 and P24 or their inherent resistance. Therefore, the resistors may be formed as a substrate resistor formed by injecting a impurity dopant into the semiconductor substrate.

In addition, the second conductive layer pattern P21 and the high resistance resistor R1 are connected by a wire T1, and the second conductive layer pattern P22 and the high resistance resistor R2 are connected by a wire T2. Similarly, the second conductive layer patterns P23 and P24 and the high resistance resistors R3 and R4 are connected by wires T3 and T4.

The first conductive layer pattern P11, formed at the rightward most portion in FIG. 5, is directly connected with an electric potential detection first pad PAD1 by a wire T5. The second conductive layer pattern P21 is connected with the first conductive layer pattern P12 of the neighboring conductive layer patterns P12, P22 by a wire T6. Similarly, the second conductive layer pattern P22 is connected with the first conductive layer pattern P13 of the pairs of the neighboring conductive layer patterns P13, P23 by a wire T7. In addition, the second conductive layer pattern P23 is connected with the first conductive layer pattern P14 of the neighboring conductive layer patterns P14, P24 by a wire T8.

The high resistance resistors R1, R2, R3 and R4 are commonly connected to an electric potential detection second pad PAD2 by a wire T9. Here, the resistors R1, R2, R3 and R4 are preferably formed of a substrate resistor and are formed in a zig-zag form, thereby decreasing the layout area of the semiconductor substrate and implementing a high capacity of the resistor.

Figure 6A:
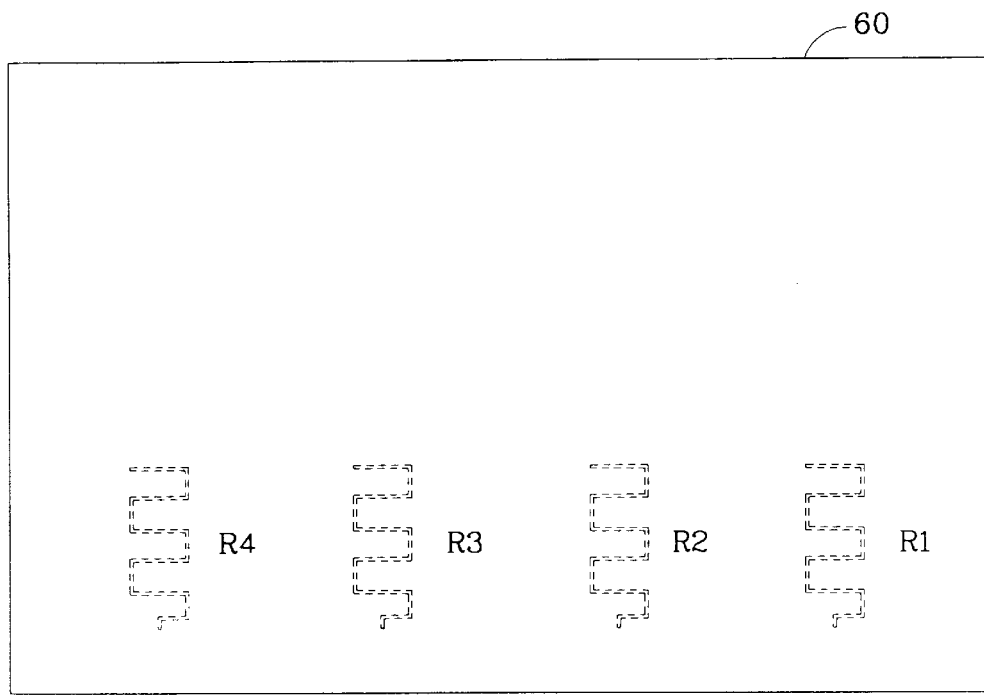
FIGS. 6A through 6E are plan views illustrating a fabrication method of the test pattern structure of FIG. 5.

The fabrication method for the test pattern of FIG. 5 will now be explained with reference to FIGS. 6A through 6E. As shown in FIG. 6A, a impurity dopant is implanted into the semiconductor substrate 60 to form a plurality of high resistance resistors R1, R2, R3 and R4. The high resistance resistors are formed in a zig-zag form, thereby minimizing the layout area of the semiconductor substrate and increasing the resistance.

Figure 6B:
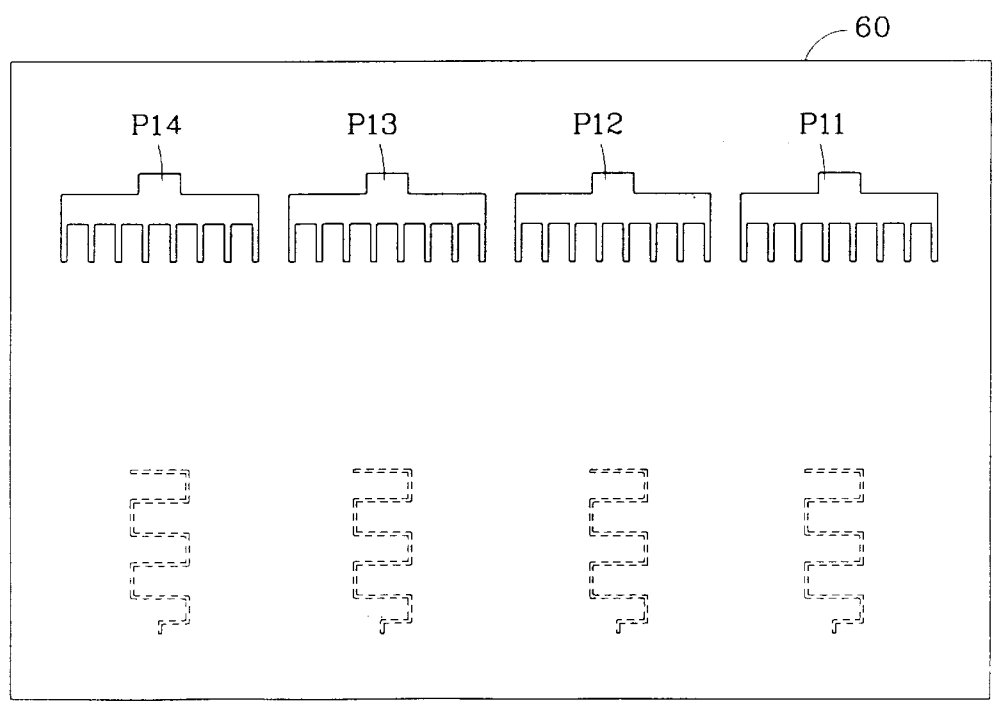

Next, as shown in FIG. 6B, an insulation layer (not shown) is formed on the semiconductor substrate 60, and a plurality of first conductive layer patterns P11, P12, P13 and P14 formed of a conductive layer (such as a polysilicon or a metal layer) are formed on the insulation layer. The first conductive layer patterns P11, P12, P13, and P14 are formed in a comb shape having a plurality of teeth. The first conductive layer patterns P11, P12, P13 and P14 and the high resistance resistors R1, R2, R3 and R4 have a one-to-one correspondence and are spaced-apart from one another by a predetermined distance. The dotted line portions of FIG. 6B represent the high resistance resistors R1, R2, R3 and R4 covered by the insulation film.

Figure 6C:
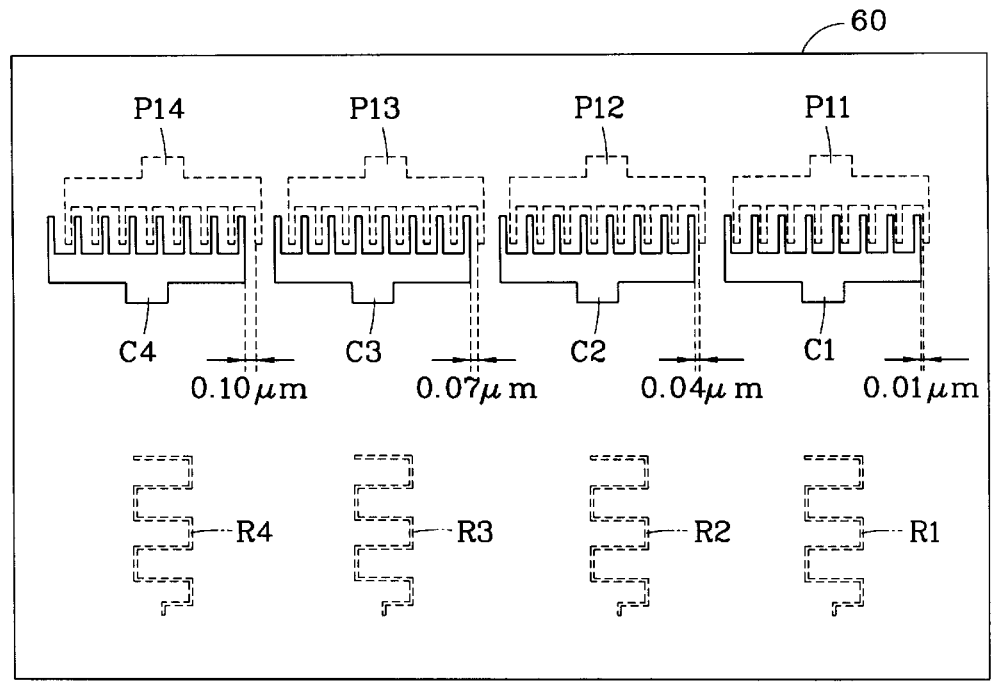

Next, as shown in FIG. 6C, an insulation film (not shown) is formed on the entire structure as shown in FIG. 6B, and the surface of the insulation film is planarized, and then the insulation film is patterned, thereby forming a plurality of cavities C1, C2, C3 and C3. The cavities C1, C2, C3, and C4 are formed in a comb shape similar to those of the first conductive layer patterns P11, P12, P13, and P14. The teeth of the first conductive layer patterns P11, P12, P13 and P14 are alternately engaged with the teeth of the cavities C1, C2, C3 and C4. At this time, the cavity C1 is formed so that the horizontal distance between the teeth of the cavity C1 and the tooth edge of the first conductive layer pattern P11 is 0.1 $\mu$m. Also, the teeth of the first conductive layer pattern P12 is 0.04 $\mu$m, and the horizontal distance between the teeth of the cavity C3 and the teeth of the first conductive layer pattern P13 is 0.07 $\mu$m, and the horizontal distance between the teeth of the cavity C4 and the first conductive layer pattern P14 is 0.1 $\mu$m.

Figure 6D:
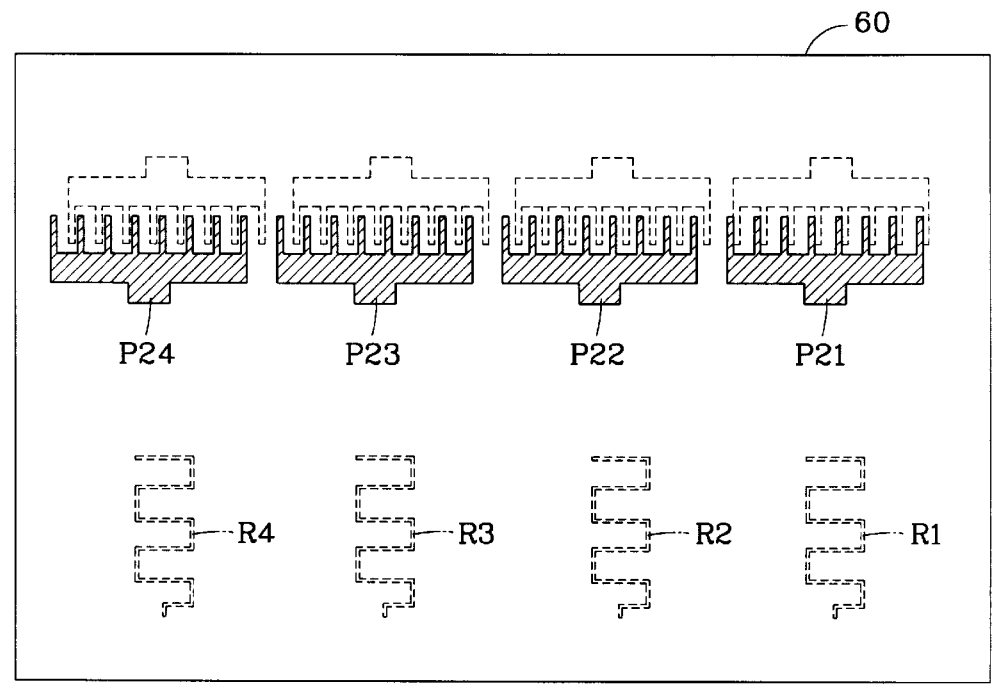

As shown in FIG. 6D, the conductive layer fills the cavities C1, C2, C3 and C4, thereby forming second conductive layer patterns P21, P22, P23 and P24.

Figure 6E:
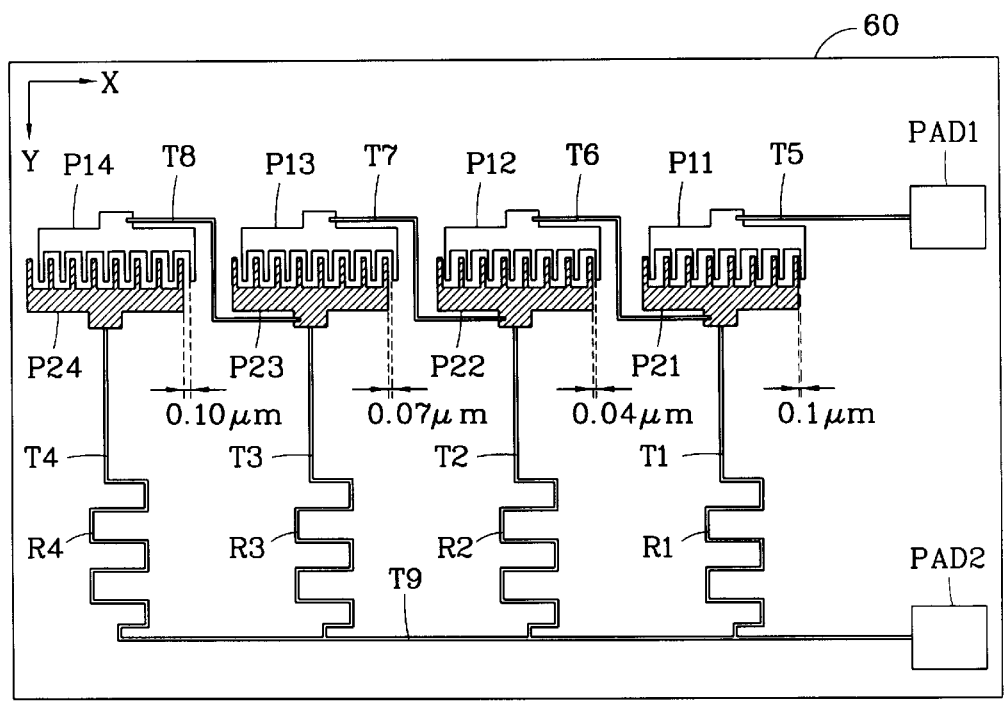

Next, an insulation film (not shown) is formed on the entire structure of FIG. 6D, and the insulation film is partially etched, thereby forming a plurality of contact holes (not shown) so that predetermined surfaces of the first and second conductive layer patterns P11, P12, P13, P14, P21, P22, P23 and P24 and the high resistance resistors R1, R2, R3 and R4 are exposed. A conductive layer (not shown) is formed inside the contact hole and on the insulation film. Thereafter, as shown in FIG. 6E, the conductive layer is patterned, thereby forming the wires T1, T2, T3, T4, T5, T6, T7, T8 and T9 as well as the first and second pads PAD1 and PAD2. The wires T1, T2, T3, T4, T5, T6, T7, T8 and T9 are formed to have the connection relationship described with reference to FIG. 5.

As described above, FIG. 5, illustrates the construction when the first conductive layer patterns P11, P12, P13 and P14 are accurately aligned. However, if a misalignment occurs in the test pattern during the above-described fabrication steps, the pattern as shown in FIG. 7 is obtained.

Namely, as shown in FIG. 5, the horizontal distance between the first conductive layer pattern and the second conductive layer pattern forming a pair of the conductive layer pattern is gradually increased by 0.01 $\mu$m, 0.04 $\mu$m, 0.07 $\mu$m, and 0.10 $\mu$m in the direction from the pairs of the rightward conductive layer patterns to the pairs of the leftward conductive layer patterns. In addition, since the first conductive layer pattern P11 and the second conductive layer pattern P21 are formed on different layers and are not over-lapped, the current does not flow between the first conductive layer pattern P11 and the second conductive layer pattern P21. Therefore, since the first pad PAD1 is electrically connected with only the first conductive layer pattern P11, a floating state occurs in the first pad PAD1, so that an electrical potential is not detected.

Figure 7:
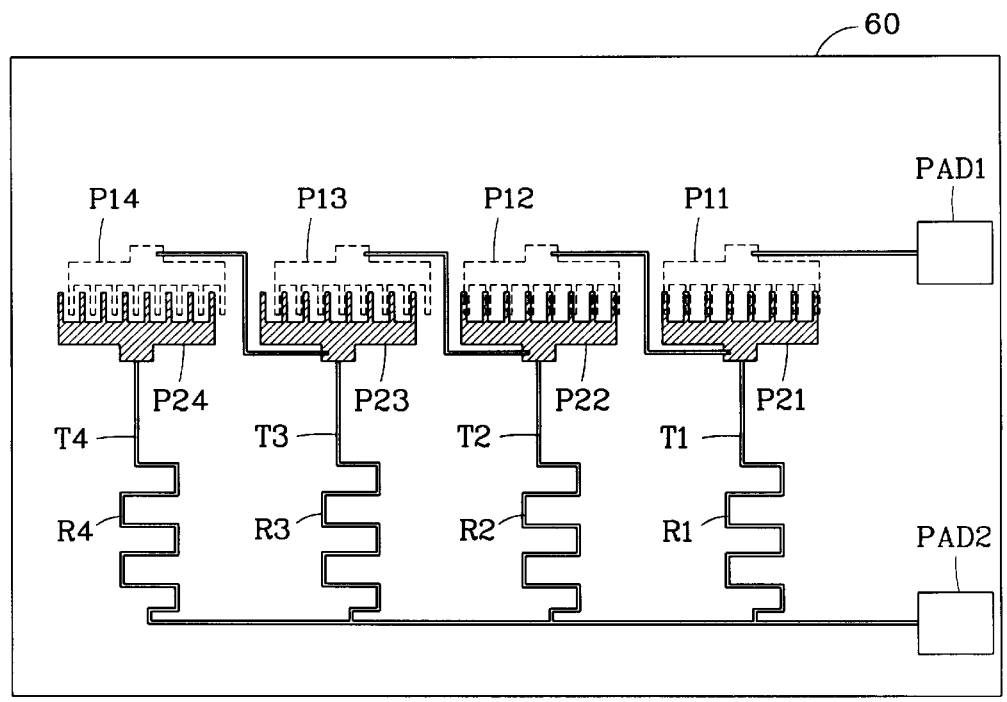
FIG. 7 is a plan view illustrating the test pattern structure of FIG. 5 when a misalignment of about 0.6 $\mu$m in the X-axis direction occurs after forming the first conductive layer pattern.

FIG. 7 illustrates the construction of a test pattern formed when a misalignment occurs by bout 0.06 $\mu$m in the X-axis direction after forming the first conductive layer pattern. Namely, hen forming the second conductive layer pattern, if the second conductive layer pattern is shifted by 0.06 $\mu$m in the rightward direction on the X-axis, the first conductive layer pattern P11 and the second conductive layer pattern P21 are over-lapped, thereby forming an electrical connection. That is, the horizontal distance between first conductive layer pattern P11 and second conductive layer P21 is negative. Similarly, the first conductive layer pattern P12 and the second conductive layer pattern P22 are over-lapped, thereby forming an electrical connection. The distance between the first conductive layer patterns P13 and P14 and the second conductive layer patterns P23 and P24 are shifted by 0.06 $\mu$m from the original distance and then become 0.1 $\mu$m and 0.04 $\mu$m, respectively. Therefore, the resistors R1 and R2 are connected in parallel between the first pad PAD1 and the second pad PAD2. Here, the resistance values of the resistors R1 and R2 are both R, and the resistance values of the first conductive layer patterns P11, P12 and the second conductive layer patterns P21, P22 are negligible as compared to the resistance value of the resistors R1 and R2. Therefore, the resistance value measured between the first and second pads PAD1 and PAD2 is R/2.

Next, the measuring principle of the misalignment using the test pattern of FIGS. 5 and 7 will be explained with reference to FIG. 8.

Figure 8:
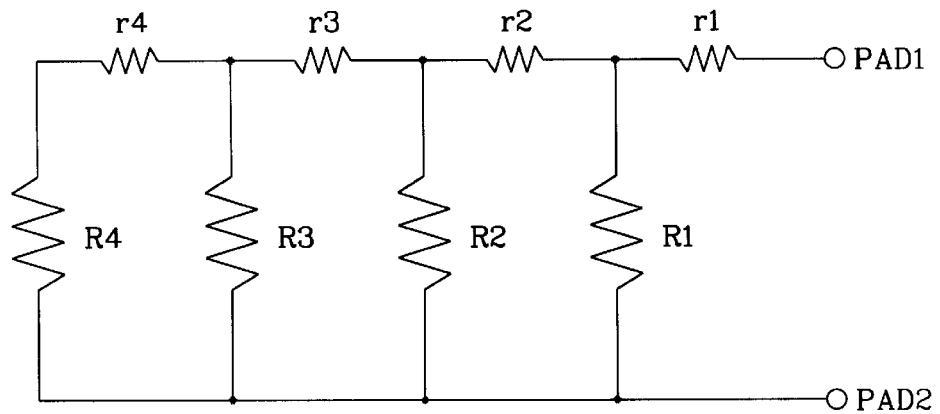
FIG. 8 is a view illustrating an equivalent circuit to the test pattern structure of FIG. 5.

FIG. 8 illustrates a circuit having a value equal to the test pattern structure of FIG. 5. Namely, the resistances of the conductive layer patterns are expressed as r1, r2, r3 and r4. In addition, the high resistance resistors are expressed as R1, R2, R3 and R4. When the first and second conductive layer patterns over-lap due to the misalignment, an electrical connection is established and a current flow path is enabled.

Therefore, if the misalignment is less than 0.01 μm, non of the pairs of the first conductive layer patterns and the second conductive layer patterns is electrically connected, and the first pad PAD1 and the second pad PAD2 are floated.

When the misalignment are occurred in a range of 0.01 μm to 0.04 μm, only the pairs of the conductive layer patterns P11 and P21 are electrically connected, and the remaining conductive layer patterns are disconnected, so that the resistance value measured at the first and second pads PAD1 and PAD2 becomes R.

When the misalignment is formed in a range of 0.05–0.07 μm, the conductive layer patterns P11, P21 and P12, P22 are electrically connected, and the resistance value measured at the pads PAD1 and PAD2 is R/2.

When the misalignment is formed in a range of 0.08–0.1 μm, the resistance value measured at the same is R/3. Therefore, it is possible to measure the misalignment based on the combined resistance value measured at the pads PAD1 and PAD2.

In the above description, a method for measuring the misalignment of the pattern in the rightward direction with respect to the X-axis was explained. However, in the present invention, it is also possible to measure the misalignment in the leftward direction with respect to the X-axis, for example, by symmetrically right-left inverting the first and second conductive layer patterns of FIG. 5. Namely, the test pattern structure can be configured such that the separation distance between the leftmost ones of the first and second conductive layer patterns is 0.01 μm, and the separation distance between the remaining first and second conductive layer patterns is incrementally increased for each pair of conductive layer patterns to the right. Thus, if a leftward misalignment occurs, the misalignment can be determined based on the resistance value measured between the pads.

Figure 9:
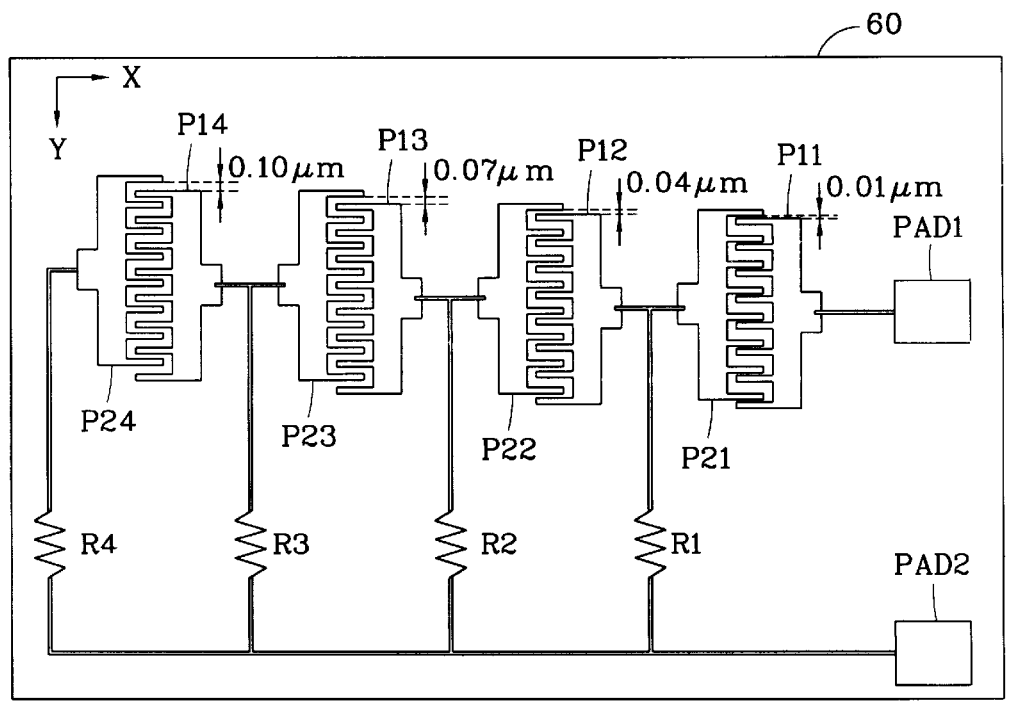
FIG. 9 is a view illustrating a test pattern structure according to another embodiment of the present invention.

FIG. 9 illustrates the structure of a test pattern for evaluating the misalignment in the Y-axis direction. Namely, the operational principle and construction of the test pattern is the same as that shown in FIG. 5 except for the test pattern for measuring the misalignment in the X-axis direction with respect to the comb-shaped first conductive layer pattern and the second conductive layer pattern. The reference numerals of FIG. 9, which are identical with the reference numerals of FIG. 5, correspond to the same elements as the elements of FIG. 5. In addition, the operations thereof are identical. However, the resistance values of the resistor measured at the first and second pad PAD1 and PAD2 may differ. In FIG. 9, the resistance value measured at the first and second PAD1 and PAD2 may differ based on the misalignment in the Y-axis direction.

As described above, in the present invention, since the test pattern is designed partially based on the known semiconductor device, the present invention may be well applicable to the actual semiconductor device fabrication process. In addition, since the test wafer is not needed, it is possible to decrease the fabrication cost of the semiconductor device.

It will be apparent to those skilled in the art that various modifications and variations can be made in the test pattern structure for measuring misalignment in semiconductor device fabrication process and measuring method of the present invention without departing from the spirit or scope of the invention. Thus, it is intended that the present invention cover the modifications and variations of this invention provided they come within the scope of the appended claims and their equivalents.

What is claimed is:

1. A test pattern structure for measuring a misalignment of a semiconductor device fabrication process, comprising:
   a semiconductor substrate;
   a plurality of spaced-apart first conductive layer patterns formed on the semiconductor substrate in a predetermined direction;
   a plurality of spaced-apart second conductive layer patterns formed on the semiconductor substrate such that each one of the second conductive layer patterns are paired with a respective one of the first conductive layer patterns, each pair of first and second conductive layer patterns defining a horizontal separation distance wherein the horizontal separation distances of the respective pairs of first and second conductive layer patterns increase along the predetermined direction;
   a plurality of resistors formed on the semiconductor substrate, each of the resistors electrically connected to a respective one of the second conductive layer patterns;
   a first pad connected to a first one of the first conductive layer patterns;
   a plurality of electrical connections connecting the second conductive layer patterns to a respective next one of the first conductive layer patterns; and a second pad commonly connected with the resistors.

2. The test pattern structure according to claim 1, wherein the resistors are formed by implanting a dopant into the semiconductor substrate.

3. The test pattern structure according to claim 2, wherein the resistors are formed in a zig-zag configuration.

4. The test pattern structure according to claim 1, wherein the resistors are formed in a zig-zag configuration.

5. The test pattern structure according to claim 1, wherein the first conductive layer patterns and the second conductive layer patterns each include a comb shape having a plurality of teeth such that the teeth of the respective pairs of first and second conductive layer patterns are mated.

6. The test pattern structure according to claim 5, wherein the teeth of the respective pairs of the first and second conductive layers define the respective horizontal separation distances.

7. The test pattern structure according to claim 1, wherein the horizontal separation distance of the pair of first and second conductive layer patterns having the first one of the first conductive layer patterns is smaller than the horizontal separation distance of an adjacent pair of the first and second conductive layer patterns.

8. The test pattern structure according to claim 1, wherein the horizontal separation distance of a first pair of the first and second conductive layer patterns is substantially zero, and the horizontal separation distance between a second pair of the first and second conductive layer patterns adjacent to the first pair is substantially 0.03 μm.

9. The test pattern according to claim 1, wherein the resistors have a higher resistance than the first and second conductive layer patterns.

10. A method for measuring a misalignment of a semiconductor device fabrication process, comprising the steps of:

forming a plurality of resistors on a semiconductor substrate;

forming a plurality of first conductive layer patterns electrically isolated from the resistors;

forming a plurality of second conductive layer patterns each respectively paired with a corresponding one of the first conductive layer patterns to define a plurality of pairs of first and second conductive layer patterns, each of the pairs of conductive layer patterns defining a respective horizontal separation distance;

forming a conductive layer electrically isolated from the first and second conductive layer patterns; and patterning the conductive layer to form a first pad, a first electrical connection connecting the first pad with a first one of the first conductive layer patterns, a second pad, a second electrical connection commonly connecting the first ends of the resistors with the second pad, a plurality of third wires connecting the resistors and respective ones of the second conductive layer patterns, and a plurality of fourth electrical connections connecting the second conductive layer patterns to a respective next one the first conductive layer patterns.

11. The method according to claim 10, wherein the step of forming a plurality of resistors includes the step of implanting a impurity dopant into the semiconductor substrate.

12. The method according to claim 11, wherein the resistors are formed in a zig-zag configuration.

13. The method according to claim 10, wherein the first conductive layer patterns and the second conductive layer patterns are each formed defining a comb shape having a plurality of teeth such that the teeth of the respective pairs of first and second conductive layer patterns are mated.

14. The method according to claim 13, wherein the teeth of the respective pairs of the first and second conductive layers are formed defining the respective horizontal separation distances.

15. The method according to claim 10, wherein the horizontal separation distance of the pair of conductive layer patterns having the first one of the first conductive layer patterns is smaller than the horizontal separation distance of an adjacent pair of conductive layer patterns.

16. The method according to claim 10, wherein the horizontal separation distance of a first pair of conductive layer patterns is substantially zero, and the horizontal separation distance between a second pair of the first and second conductive layer patterns adjacent to the first pair is substantially 0.03 $\mu$m.

17. The method according to claim 10, wherein the step of forming the plurality of first conductive layer patterns includes the steps of:

forming a first insulation film on the resistors and the semiconductor substrate; and forming the first conductive layer patterns on the first insulation film.

18. The method according to claim 17, wherein the step of forming the plurality of second conductive layer patterns includes the steps of:

forming a second insulation film on the first conductive layer patterns and the first insulation film;

forming a plurality cavities in the second insulation film by etching the second insulation film, each of the cavities being spaced-apart from a corresponding one of the first conductive layer patterns by a respective horizontal separation distance; and forming the plurality of second conductive layer patterns in the cavities.

19. The method according to claim 18, wherein the step of forming the conductive layer includes the steps of:

forming a third insulation film on at least the second conductive layer pattern; and forming the conductive layer on the third insulation film.

20. The method according to claim 10, wherein the step of forming the plurality of second conductive layer patterns includes the steps of:

forming an insulation film on at least the first conductive layer patterns;

forming a plurality cavities on the insulation film by etching the insulation film, each of the cavities being spaced-apart from a corresponding one of the first conductive layer patterns by a respective horizontal separation distance; and forming the plurality of second conductive layer patterns in the cavities.

21. The method according to claim 10, further comprising the step of measuring resistance between first and second pads.

22. The method according to claim 10, wherein a resistance of each of the resistors is larger than a resistance of each of the first and second conductive layer patterns.

* * * * *